(12) United States Patent
Kim et al.

(10) Patent No.: US 12,385,946 B2
(45) Date of Patent: Aug. 12, 2025

(54) METHOD OF INSPECTING TIP OF ATOMIC FORCE MICROSCOPE AND METHOD OF MANUFACTURING SEMICONDUCTOR DEVICE

(71) Applicant: Samsung Electronics Co., Ltd., Suwon-si (KR)

(72) Inventors: Kwangeun Kim, Suwon-si (KR); Seungbum Hong, Daejeon (KR); Sungyoon Ryu, Seoul (KR); Hoon Kim, Daejeon (KR); Jiwon Yeom, Daejeon (KR); Seokjung Yun, Daejeon (KR); Souk Kim, Seoul (KR); Younghoon Sohn, Seoul (KR); Yusin Yang, Seoul (KR)

(73) Assignees: SAMSUNG ELECTRONICS CO., LTD.; KOREA ADVANCED INSTITUTE OF SCIENCE AND Technology, Daejeon (KR)

( * ) Notice: Subject to any disclaimer, the term of this patent is extended or adjusted under 35 U.S.C. 154(b) by 546 days.

(21) Appl. No.: 17/878,414

(22) Filed: Aug. 1, 2022

(65) Prior Publication Data

US 2023/0194567 A1 Jun. 22, 2023

(30) Foreign Application Priority Data

Dec. 21, 2021 (KR) .......................... 10-2021-0184327

(51) Int. Cl.
*G01Q 40/00* (2010.01)
*G01Q 70/10* (2010.01)
(Continued)

(52) U.S. Cl.
CPC .............. *G01Q 40/00* (2013.01); *G01Q 70/10* (2013.01); *H01L 22/12* (2013.01); *G01Q 40/02* (2013.01);
(Continued)

(58) Field of Classification Search
CPC ........ G01Q 40/00; G01Q 40/02; G01Q 70/08; G01Q 70/10; G01Q 60/38; H01L 22/12
See application file for complete search history.

(56) References Cited

U.S. PATENT DOCUMENTS 5,578,745 A * 11/1996 Bayer .................... G01Q 40/02
73/1.73
5,591,903 A 1/1997 Vesenka et al.
(Continued)

FOREIGN PATENT DOCUMENTS

JP H06117844 A 4/1994
JP H07103989 A 4/1995
(Continued)

*Primary Examiner* — Michael M Trinh
(74) *Attorney, Agent, or Firm* — Muir Patent Law, PLLC

(57) ABSTRACT

A method of operating an atomic force microscope (AFM) is provided. The method includes inspecting a sample by using the AFM and inspecting a tip of a probe of the AFM by using a characterization sample. The characterization sample includes a first characterization pattern that includes a line and space pattern of a first height, a second characterization pattern that includes a line and space pattern of a second height that is lower than the first height, and a third characterization pattern that includes a line and space pattern of a third height that is lower than the second height, and includes a rough surface.

8 Claims, 27 Drawing Sheets

(51) Int. Cl.
*H01L 21/66* (2006.01)
*G01Q 40/02* (2010.01)
*G01Q 60/38* (2010.01)
*G01Q 70/08* (2010.01)
*H10B 12/00* (2023.01)

(52) U.S. Cl.
CPC ............. *G01Q 60/38* (2013.01); *G01Q 70/08* (2013.01); *H10B 12/053* (2023.02)

(56) References Cited

U.S. PATENT DOCUMENTS

| | | | |
|---|---|---|---|
| 6,250,143 B1* | 6/2001 | Bindell | G01Q 60/38 |
| | | | 850/52 |
| 8,650,661 B2 | 2/2014 | Dahlen et al. | |
| 8,739,310 B2 | 5/2014 | Foucher et al. | |
| 9,874,582 B2 | 1/2018 | Humphris | |
| 10,191,081 B2* | 1/2019 | Park | G01Q 10/065 |
| 2005/0194534 A1* | 9/2005 | Kneedler | G01Q 30/04 |
| | | | 250/307 |
| 2005/0283335 A1* | 12/2005 | Banke | G01N 1/32 |
| | | | 702/170 |
| 2006/0071164 A1* | 4/2006 | Rogers | G01Q 40/02 |
| | | | 250/309 |
| 2010/0313312 A1* | 12/2010 | Dahlen | G01Q 60/38 |
| | | | 850/20 |
| 2011/0093990 A1* | 4/2011 | Foucher | G01Q 40/00 |
| | | | 850/33 |
| 2021/0311090 A1* | 10/2021 | Biemond | G01Q 10/065 |

FOREIGN PATENT DOCUMENTS

| | | | |
|---|---|---|---|
| JP | 2009058473 A | 3/2009 | |
| JP | 2009058480 A | 3/2009 | |
| JP | 4859789 B2 | 1/2012 | |

* cited by examiner

Tip radius = 5nm

Tip radius = 10nm

Tip radius = 30nm

METHOD OF INSPECTING TIP OF ATOMIC FORCE MICROSCOPE AND METHOD OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2021-0184327, filed on Dec. 21, 2021, in the Korean Intellectual Property Office, the disclosure of which is incorporated by reference herein in its entirety.

BACKGROUND

Aspects of the inventive concept relate to a method of inspecting a tip of an atomic force microscope (AFM) and a method of manufacturing a semiconductor device.

A tip of a probe of an AFM may be evaluated by scanning a characterization sample by the tip. The tip of the probe may be evaluated by generating a tip model based on an image of the characterization sample generated by using the tip of the probe of the AFM. A characterization sample may include a surface structure suitable for inferring a tip state when imaging is performed by using a probe. A representative characterization sample includes a surface patterned in a line and space shape.

Evaluation of a tip may elaborate a three-dimensional tip model by continuously analyzing local peaks of a surface topographic image. A gradient most quickly away from each peak in all directions may be measured at the peak, and minimum sharpness of a tip may be determined from the gradient. A premise of this modeling is that data of an image generated by measurement using an AFM cannot have a sharper gradient than a gradient of a tip. When a process of determining sharpness of a tip is recursively performed on a plurality of local peaks, if there is a sharper gradient than gradients discovered at all peaks previously analyzed, a tip model is updated to a new and sharper tip estimation value.

SUMMARY

Aspects of the inventive concept provide a method of operating an atomic force microscope (AFM) with improved reliability and a method of manufacturing a semiconductor device.

According to an aspect of the inventive concept, there is provided a method of operating an AFM. The method includes: inspecting a sample by using the AFM; and inspecting a tip of a probe of the AFM by using a characterization sample, wherein the characterization sample includes: a first characterization pattern that includes a line and space pattern of a first height; a second characterization pattern that includes a line and space pattern of a second height that is lower than the first height; and a third characterization pattern that includes a line and space pattern of a third height that is lower than the second height, and includes a rough surface.

According to another aspect of the inventive concept, there is provided a method of operating an AFM. The method includes: inspecting a sample by using the AFM; generating, based on the inspecting, a scanned sample image including one or more abnormalities; inspecting a tip of a probe of the AFM by using a characterization sample to determine if the tip is normal or abnormal; determining that the sample is abnormal if the tip of the AFM is determined to be normal; and replacing the tip of the AFM if the tip of the AFM is determined to be abnormal.

According to another aspect of the inventive concept, there is provided a method of manufacturing a semiconductor device. The method includes: forming active patterns separated from each other on a substrate, by anisotropically etching the substrate; forming a device isolation layer in a device isolation trench that is a space between the active patterns; forming gate trenches separated from each other in a first direction that is parallel to an upper surface of the substrate, extending in a second direction that is parallel to the upper surface of the substrate and perpendicular to the first direction, and partially penetrating into the device isolation layer and the active patterns; forming a dielectric material layer partially filling the gate trench; forming a gate conductive material layer filling the gate trench; forming a gate conductive pattern in the gate trench by planarizing the dielectric material layer and the gate conductive material layer; forming a gate mask on the gate conductive pattern; forming first impurity regions and second impurity regions by doping upper parts of the active patterns; forming a capping layer and a first interlayer insulating layer covering the gate mask, the first impurity regions, and the second impurity regions; etching the capping layer and the first interlayer insulating layer to form a groove through which the first impurity regions are exposed; inspecting any one of the device isolation trench, the dielectric material layer, the gate conductive pattern, and the groove by using an AFM; inspecting a tip of a probe of the AFM by using a characterization sample to determine if the tip is normal or abnormal; and determining that any one of the device isolation trench, the dielectric material layer, the gate conductive pattern, and the groove is abnormal, based in part on whether the tip is determined to be normal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
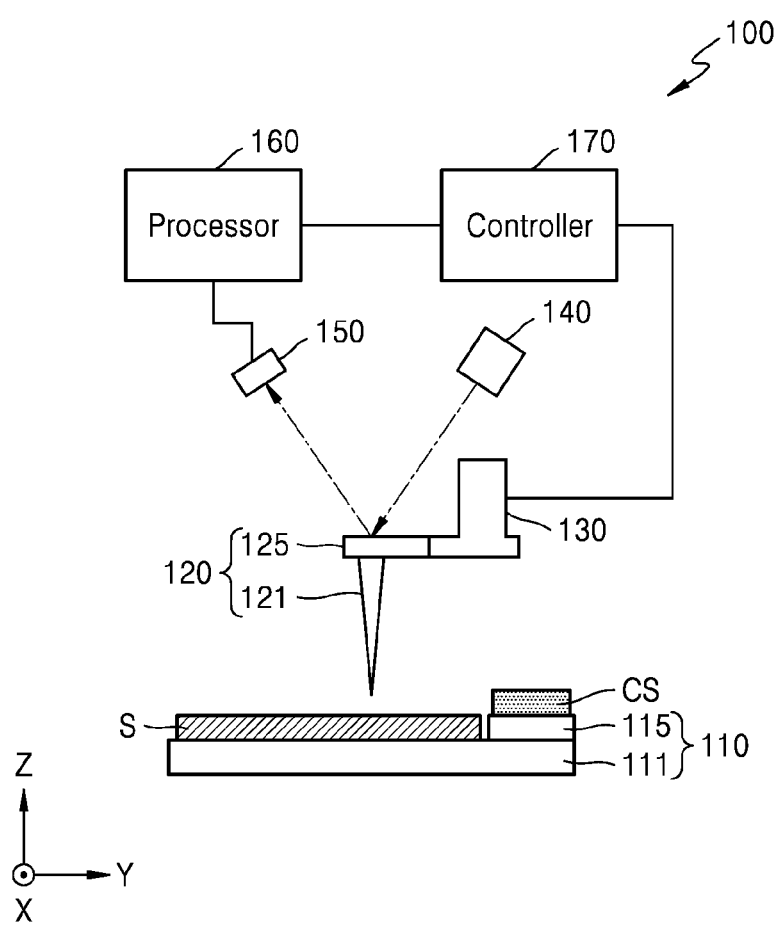
FIG. 1 schematically illustrates an atomic force microscope (AFM)

Hereinafter, embodiments of the inventive concept are described in detail with reference to the accompanying drawings. Like reference numerals in the drawings denote like elements, and a repeated description thereof is omitted.

FIG. 1 schematically illustrates an atomic force microscope (AFM) 100 capable of performing an inspection method, according to example embodiments.

Referring to FIG. 1, the AFM 100 may include a sample support 110, a probe 120, a scanner 130, a laser device 140, a photodetector 150, a processor 160, and a controller 170.

The AFM 100 may sense a surface of a sample S with sensitivity of an individual atom level on the surface of the sample S. The AFM 100 may inspect the surface of the sample S by detecting a Van der Waals force or an electrostatic force between a tip 121 of the probe 120 and the sample S. The AFM 100 may inspect the sample S by horizontally raster-scanning the surface of the sample S by using the tip 121.

Although the size of the tip 121 is exaggeratedly shown for convenience of drawing unlike actual scaling, a Z-direction length of the tip 121 may be within a range of several nm to hundreds of nm.

The AFM 100 may include any one of a contact AFM, a force modulus microscope (FMM), a lateral force microscope (LFM), a scanning capacitance microscope (SCM), a scanning thermal microscope (SThM), a contactless AFM, a conductive AFM (CAFM), a dynamic force microscope (DFM), an electrostatic force microscope (EFM), a Kelvin probe force microscope (KPFM), a magnetic force microscope (MFM), a piezoelectric force microscope (PFM), and a dynamic contact AFM.

The AFM 100 may operate in a contact mode, a contactless mode, and a tapping mode. When the AFM 100 operates in the contact mode, a distance between the tip 121 and the surface of the sample S may be several angstroms. At a distance of about several angstroms, a repulsive force is dominant between the tip 121 and the surface of the sample S. In the contact mode, a soft tip 121 may be used to prevent damage to the sample S. In a repulsive force territory, because a change in a force applied to the tip 121 is large in response to a change in a distance between the tip 121 and the surface of the sample S, the surface of the sample S may be inspected with a high resolution.

When the AFM 100 operates in the contactless mode, the distance between the tip 121 and the surface of the sample S may be hundreds of angstroms or more. At a distance of about hundreds of angstroms, an attractive force is dominant between the tip 121 and the surface of the sample S. In the contactless mode, a hard tip 121 may be used to prevent contact between the tip 121 and the surface of the sample S due to the attractive force. A resolution of the contactless mode, is lower than that of the contact mode. A scanning speed of the contactless mode, is higher than that of the contact mode.

In the tapping mode, the tip 121 may vibrate above the sample S to cause only short intermittent contacts, thereby minimizing damage to the sample S due to the contacts. In a tapping mode operation, constant vibration may be provided to the tip 121 to sense the sample S, thereby preventing damage to the sample S. In addition, the tapping mode operation may provide the same level of resolution as that in the contact mode even when a structure having a large height difference is formed on the surface of the sample S.

At least one characterization sample CS for inspecting the probe 120 may be on the sample support 110. The sample support 110 may support and fix the sample S and the characterization sample CS. The sample support 110 may be a vacuum chuck or an electrostatic chuck. The characterization sample CS may include a die having a thin film nanostructure formed thereon. The nanostructure may form one or more well-defined characterization patterns that may be used to reverse image the tip 121 of the probe 120 and thereby determine characteristics of the tip 121, such as tip shape, tip width (e.g., radius), inclination, and the like.

The sample support 110 may include a sample support part 111 supporting the sample S and a characterization sample support part 115 supporting the characterization sample CS. The characterization sample support part 115 may be on the sample support part 111 but is not limited thereto. The sample support 110 may move the sample S in the X direction, Y direction, Z direction, or rotate the sample S so that the sample S is scanned by the probe 120.

The X direction and the Y direction are parallel to an upper surface of the sample S (i.e., an opposite surface of a lower surface facing the sample support 110). The Z direction is perpendicular to the upper surface of the sample S. The X direction, the Y direction, and the Z direction may be substantially perpendicular to one another.

The probe 120 may include a cantilever 125 and the tip 121 connected to an end portion of the cantilever 125. The cantilever 125 may be, for example, a plate-shaped spring easily bent by a minute force of about several nanonewtons (nN). An end portion of the tip 121 may be processed to a size of about several atoms by nanotechnology. The resolution of the AFM 100 depends on the sharpness of the end portion of the tip 121.

The scanner 130 may scan the sample S by driving the probe 120 in the X direction and the Y direction. Although not illustrated, the controller 170 may be communicatively connected to the sample support 110. Accordingly, in the alternative, the scanner 130 may scan the sample S by driving the sample substrate 110 in the X direction and the Y direction for example. While scanning the sample S, the tip 121 deflects by an attractive force or a repulsive force from features on the surface of the sample S. The deflection of the tip 121 may cause bending of the cantilever 125. The bending of the cantilever 125 may be detected by an optical lever including the laser device 140 and the photodetector 150.

The laser device 140 generates a laser beam through oscillation. The laser beam is radiated on the end portion of the cantilever 125, reflected from the end portion of the cantilever 125, and oriented to the photodetector 150. The photodetector 150 may include photodiodes divided into two segments or four segments according to a measurement scheme. The photodetector 150 may amplify and detect a small deflection of the cantilever 125 by sensing the laser beam.

The controller 170 may precisely control a Z-direction position of the scanner 130 (or sample support 110). For example, the controller 170 may control the scanner 130 (or sample support 110) so that a Z-direction distance between the tip 121 and the surface of the sample S is constant. As another example, the controller 170 may control the scanner 130 (or sample support 110) so that a force between the tip 121 and the surface of the sample S is constant.

By scanning the sample S using the scanner 130, information regarding the sample may be obtained and processed by the processor to generate an image of the sample. For example, the processor 160 may generate a topographic image of the surface of the sample S by storing a Z-direction position of the scanner 130 (or a Z-direction position of the probe 120 or sample support 110) according to X-direction and Y-direction coordinates on the sample S. An image generated by scanning the sample S using the scanner 130, such as the topographic image, may be referred to herein as a "scanned sample image."

The processor 160 may further generate an image of the shape of the tip 121. According to example embodiments, a thickness of the tip 121 according to a height from the end portion of the tip 121, and the sharpness of the end portion of the tip 121 may be determined based on an image generated by scanning any one of the sample S and the characterization sample CS by using the tip 121.

Figure 2:
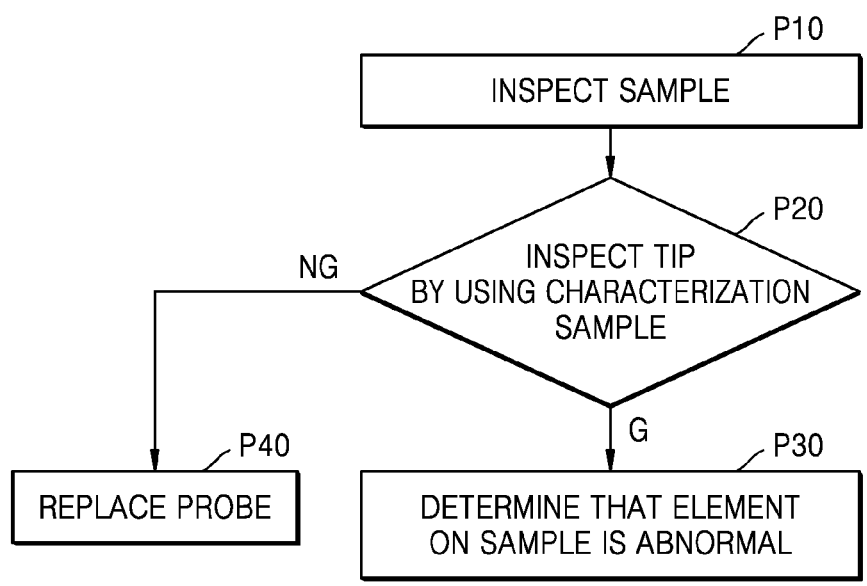
FIG. 2 is a flowchart for describing a method of operating an AFM, according to example embodiments.

FIG. 2 is a flowchart for describing a method of operating an AFM, according to example embodiments.

Referring to FIGS. 1 and 2, the sample S may be inspected in step P10. Inspecting the sample S may include scanning the surface of the sample S by using the AFM 100 to generate a scanned sample image, as described above. An analysis of the scanned sample image may indicate that one or more abnormalities are present in the scanned sample image. However, it may be difficult to discern whether the one or more abnormalities correspond to abnormalities present on the surface of sample S or whether the abnormalities correspond to (i.e., are a result of) a defect in the tip 121 of the probe 120.

The method of operating an AFM as set forth in the flowchart of FIG. 2 may be used to discern whether or not one or more abnormalities present in a scanned sample image correspond to abnormalities present on the surface of sample S or whether the abnormalities correspond to (i.e., are a result of) a defect in the tip 121 of the probe 120. For example, if in step P10 it is determined that the scanned sample image is abnormal (e.g., one or abnormalities are present in the scanned sample image), the tip 121 may be inspected by using the characterization sample CS in step P20. Whether the scanned sample image is abnormal may be determined by comparing the scanned sample image to an image of a standard sample (i.e., "scanned standard sample image"). According to example embodiments, inspecting the tip 121 by using the characterization sample CS may include scanning the characterization sample CS by using the tip 121.

Hereinafter, the characterization sample CS is described in detail with reference to FIGS. 3A to 5.

Figure 3A:
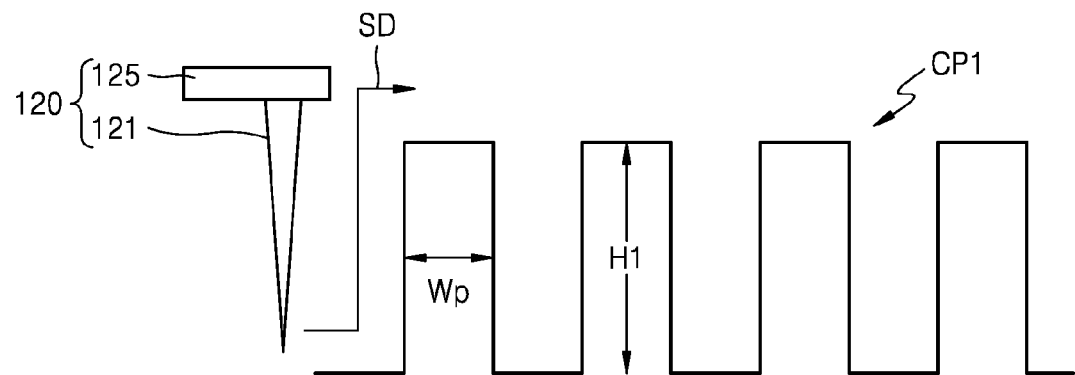
FIG. 3A illustrates a first characterization pattern of a characterization sample.

FIG. 3A illustrates a first characterization pattern CP1 of the characterization sample CS.

Figure 3B:
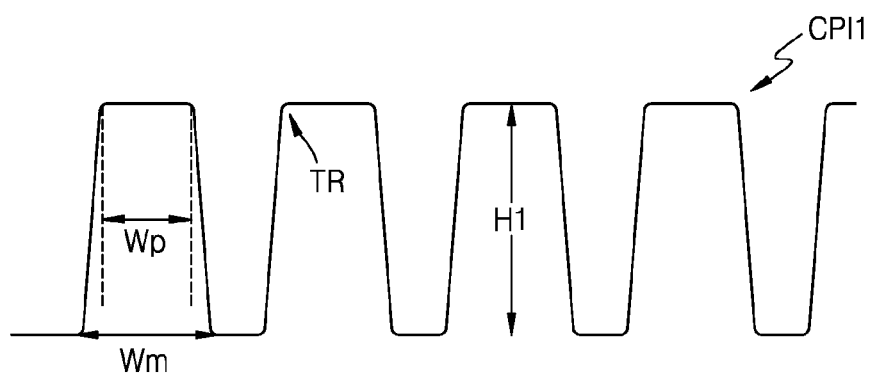
FIG. 3B illustrates an image generated by scanning the first characterization pattern of the characterization sample.

FIG. 3B illustrates an image CPI1 generated by scanning the first characterization pattern CP1 of the characterization sample CS.

Figure 3C:
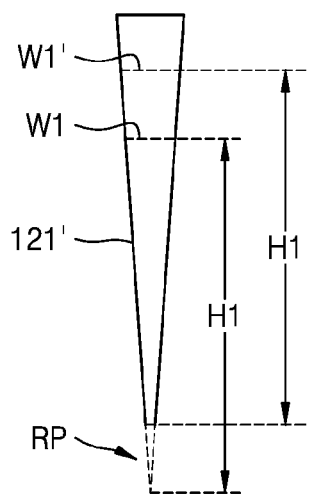
FIG. 3C illustrates a damaged tip of an AFM.

FIG. 3C illustrates a damaged tip 121'.

Referring to FIG. 3A, the characterization sample CS may include the first characterization pattern CP1. The first characterization pattern CP1 may be an concave-convex pattern having a first height H1. For example, the first characterization pattern CP1 may be a line and space pattern of the first height H1. As another example, the first characterization pattern CP1 may include a plurality of holes arranged in a matrix form in the X direction and the Y direction, each hole having the first height H1. A planar shape of the plurality of holes may be any one of a circle, an oval, and a polygon.

According to example embodiments, the tip 121 may be inspected by using the first characterization pattern CP1 that recursively appears, and data of the tip 121 may be statistically processed, thereby improving the reliability of the inspection of the tip 121.

According to example embodiments, the first height H1 may be within a range of about 100 nm to about 250 nm. According to example embodiments, the first characterization pattern CP1 may be used to determine a width of the tip 121 at the first height H1 that is relatively high.

Referring to FIGS. 3A and 3B, when the first characterization pattern CP1 is scanned in a scanning direction SD by using the probe 120, the scanned image CPI1 of FIG. 3B may be generated. Unlike the first characterization pattern CP1, the scanned image CPI1 may include inclination and corner rounding of an uneven pattern according to the shape of the tip 121.

According to example embodiments, the shape of the tip 121 may be determined by deconvolution of the scanned image CPI1. For example, the width of the tip 121 at the first height H1 may be obtained by the deconvolution of the scanned image CPI1.

According to example embodiments, a radius of the end portion of the tip 121 may be determined from the radius of curvature of a corner of the uneven pattern appearing in the scanned image CPI1. According to example embodiments, inclination of the tip 121 may be determined from the inclination of the uneven pattern of the scanned image CPI1. According to example embodiments, the width of the tip 121 at the first height H1 may be determined by comparing a width Wp of the first characterization pattern CP1 to a width Wm of the scanned image CPI1. For example, the width of the tip 121 at the first height H1 may be represented by Equation 1.

$$\text{Width of the tip 121 at the first height} = Wm - Wp \quad \text{[Equation 1]}$$

Referring to FIG. 3C, when an end portion of the tip 121' is damaged, a total height of the tip 121' is lowered as much as a damaged part RP. Accordingly, a width W1' of the tip 121' at the first height H1 after damage may be greater than a width W1 of the tip 121' at the first height H1 before the damage. When a width of the uneven pattern formed on the sample (S, see FIG. 1) is less than the width W1' of the tip 121' at the first height H1, the tip 121' cannot reach an actual bottom surface of the uneven pattern, and thus, a height of the concave-convex pattern may be wrongly recognized to be lower than an intended height.

Referring back to FIGS. 1 and 3A, when a thickness of the tip 121 of the probe 120 at the first height H1, which is measured through the first characterization pattern CP1 of the characterization sample CS, is greater than a set value, it may be determined that the tip 121 of the probe 120 is abnormal.

Figure 4:
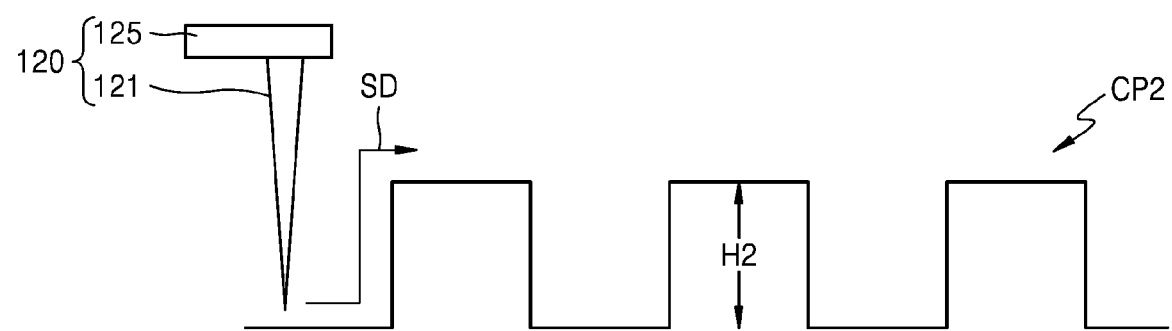
FIG. 4 illustrates a second characterization pattern of a characterization sample.

FIG. 4 illustrates a second characterization pattern CP2 of the characterization sample CS.

Referring to FIG. 4, the second characterization pattern CP2 may be an uneven pattern having a second height H2. For example, the second characterization pattern CP2 may be a line and space pattern of the second height H2. As another example, the second characterization pattern CP2 may include a plurality of holes arranged in the X direction and the Y direction, each hole having the second height H2.

According to example embodiments, the second height H2 may be within a range of about 50 nm to about 150 nm. According to example embodiments, the second characterization pattern CP2 may be used to determine a width of the tip 121 at the second height H2 that is relatively lower than the first height H1 (see FIG. 3a). Determining the width of the tip 121 at the second height H2 is substantially similar to that described with reference to FIGS. 3A to 3C, and thus, a description thereof is not repeated.

Referring back to FIGS. 1 and 4, when a thickness of the tip 121 of the probe 120 at the second height H2, which is measured through the second characterization pattern CP2 of the characterization sample CS, is greater than a set value, it may be determined that the tip 121 of the probe 120 is abnormal.

Figure 5:
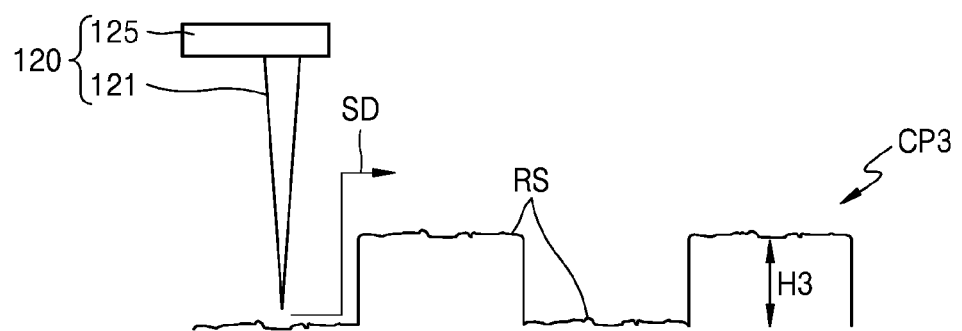
FIG. 5 illustrates a third characterization pattern of a characterization sample.

FIG. 5 illustrates a third characterization pattern CP3 of the characterization sample CS.

Referring to FIG. 5, the third characterization pattern CP3 may be an uneven pattern having a third height H3. According to example embodiments, the third characterization pattern CP3 may include a rough surface RS.

According to example embodiments, a root mean square surface roughness Rq of the rough surface RS of the third characterization pattern CP3 may be within a range of about 0.5 nm to about 1.5 nm. According to example embodiments, the root mean square surface roughness Rq of the rough surface RS of the third characterization pattern CP3 may be about 0.6 nm or more. According to example embodiments, the root mean square surface roughness Rq of the rough surface RS of the third characterization pattern CP3 may be about 0.7 nm or more. According to example embodiments, the root mean square surface roughness Rq of the rough surface RS of the third characterization pattern CP3 may be about 0.8 nm or more. According to example embodiments, the root mean square surface roughness Rq of the rough surface RS of the third characterization pattern CP3 may be about 1.4 nm or less. According to example embodiments, the root mean square surface roughness Rq of the rough surface RS of the third characterization pattern CP3 may be about 1.3 nm or less. According to example embodiments, the root mean square surface roughness Rq of the rough surface RS of the third characterization pattern CP3 may be about 1.2 nm or less. According to example embodiments, the root mean square surface roughness Rq of the rough surface RS of the third characterization pattern CP3 may be about 1.1 nm or less. According to example embodiments, the root mean square surface roughness Rq of the rough surface RS of the third characterization pattern CP3 may be about 1 nm or less.

According to example embodiments, when the root mean square surface roughness Rq of the rough surface RS of the third characterization pattern CP3 is excessively large (e.g., 1.5 nm or more), the end portion of the tip 121 of the probe 120 may be damaged while scanning the third characterization pattern CP3. According to example embodiments, when the root mean square surface roughness Rq of the rough surface RS of the third characterization pattern CP3 is excessively small (e.g., 0.5 nm or less), it is impossible to measure the root mean square surface roughness Rq of the rough surface RS even with a good tip 121 of the probe 120.

When the root mean square surface roughness Rq of the rough surface RS of the third characterization pattern CP3 measured by the probe 120 is within a preset range, it may be determined that the end portion of the tip 121 of the probe 120 is not damaged (i.e., sufficiently sharp). When the root mean square surface roughness Rq of the rough surface RS of the third characterization pattern CP3 measured by the probe 120 is outside of the preset range, it may be determined that the tip 121 of the probe 120 is damaged. For example, when the root mean square surface roughness Rq of the rough surface RS of the third characterization pattern CP3 is about 0.8 nm, if the root mean square surface roughness Rq of the rough surface RS measured by the tip 121 of the probe 120 is 1.1 nm or more, or 0.5 nm or less, it may be determined that the end portion of the tip 121 of the probe 120 is damaged.

Referring back to FIG. 2, if it is determined that the tip 121 is good (G) (i.e., not damaged) as the result of inspecting the tip 121 by using the characterization sample CS, it may be determined in step P30 that an element on the sample S is abnormal. For example, it may be determined that the one or more abnormalities present in the scanned sample image generated in step P10 correspond to abnormalities on the surface of the sample S.

If it is determined that the tip 121 is not good (NG) (i.e., damaged) as the result of inspecting the tip 121 by using the characterization sample CS, the tip 121 may be replaced in step P40. After replacing the tip 121, the sample S may be inspected again in step P10.

According to example embodiments, the aforementioned method of operating the AFM 100 may be performed in real-time while inspecting the sample S by using the AFM 100. Accordingly, it may be prevented that damage to the tip 121 is wrongly recognized as abnormality of an element and a feature of the sample S, and when damage occurs to the tip 121 while inspecting the sample S, the tip 121 may be replaced, and thus, the reliability of an operation of the AFM 100 may be improved. Alternatively, the inspection step P20 of the tip 121 may be performed separately as, for example, a calibration operation prior to inspecting sample S. Accordingly, using the characterization sample CS, a determination may be made as to whether the tip 121 is good (G) (i.e., not damaged) or not good (NG) (i.e., damaged) prior to inspecting sample S.

Figure 6A:
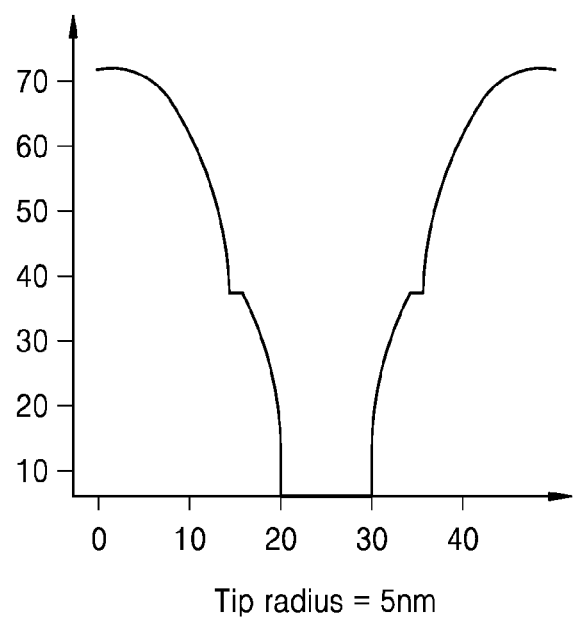
FIGS. 6A to 6C show changes in an image of a sample according to sharpness of an end portion of a tip of an AFM.
Figure 6B:
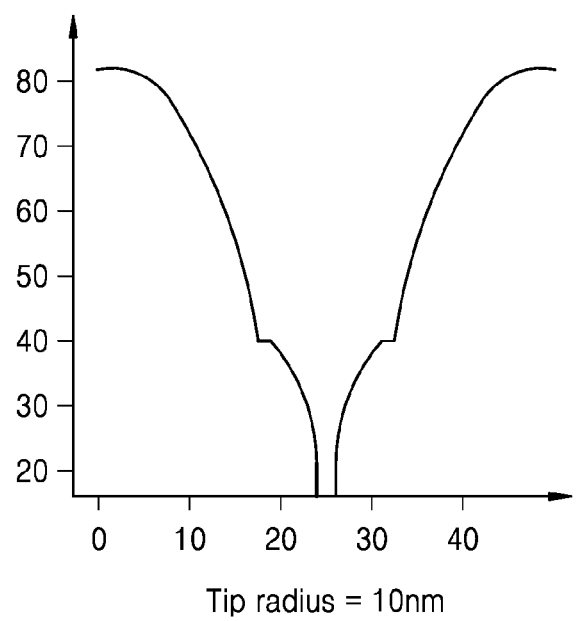
Figure 6C:
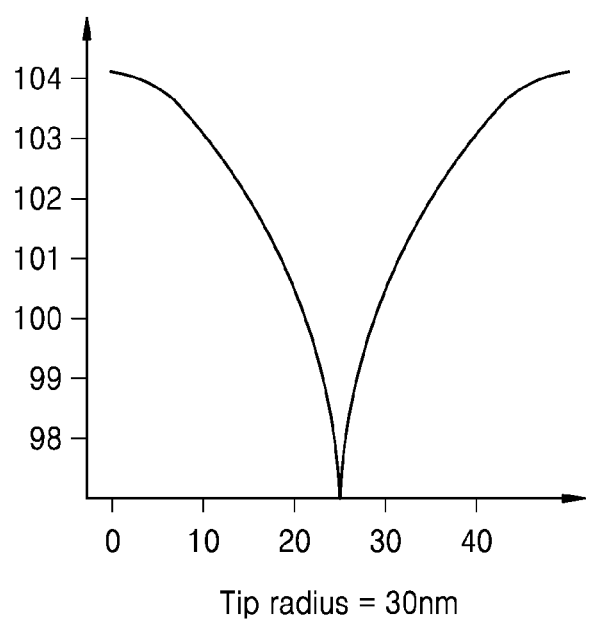

FIGS. 6A to 6C show changes in a scanned image of the sample S according to sharpness of the end portion of the tip 121. Herein, the sharpness of the end portion of the tip 121 may be digitized to a radius of the end portion of the tip 121.

More particularly, FIG. 6A shows a scanned image of the sample S when the radius of the end portion of the tip 121 is 5 nm, FIG. 6B shows a scanned image of the sample S when the radius of the end portion of the tip 121 is 10 nm, and FIG. 6C shows a scanned image of the sample S when the radius of the end portion of the tip 121 is 30 nm.

Referring to FIGS. 1 and 6A to 6C, when the radius of the end portion of the tip 121 varies, a scanned image of the same portion of the sample S may vary. According to example embodiments, the processor 160 may predict a state (e.g., a shape of the end portion) of the tip 121 from a scanned image of the sample S, based on existing data of the scanned image of the sample S. The controller 170 may generate a control signal for scanning only an appropriate portion of the characterization sample CS in response to the prediction of the processor 160. Accordingly, a time taken to inspect the tip 121 may be reduced, and a turnaround time for inspection using the AFM 100 may be reduced.

As another example, the shape of the tip 121 may be obtained with high precision by scanning all patterns of the characterization sample CS by the tip 121.

Figure 7:
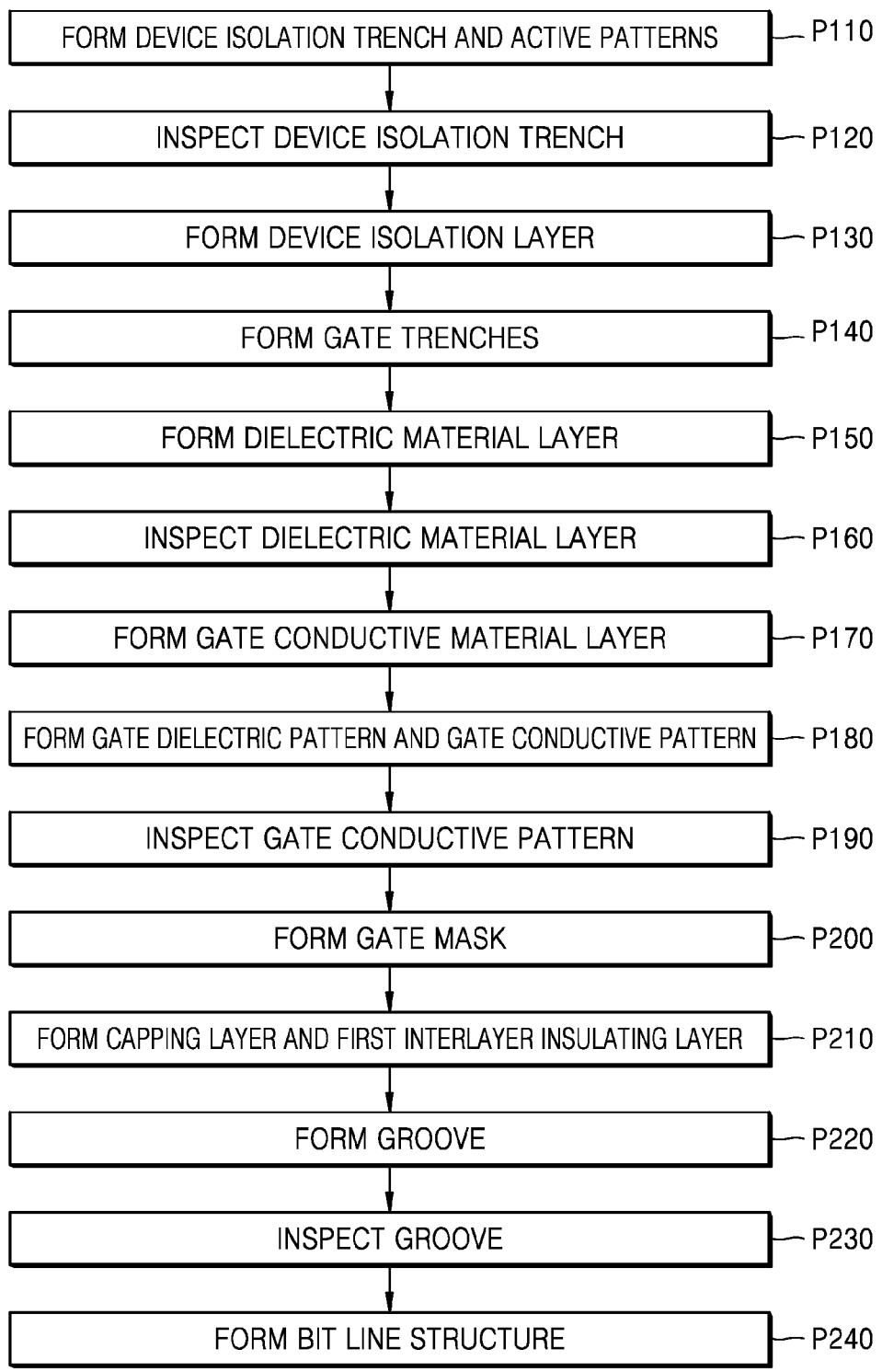
FIG. 7 is a flowchart for describing a method of manufacturing a semiconductor device, according to example embodiments.

FIG. 7 is a flowchart for describing a method of manufacturing a semiconductor device, according to example embodiments.

FIGS. 8A, 8B, 9A, 9B, 10A, 10B, and 11 to 14 are top views and cross-sectional views for describing the method of manufacturing a semiconductor device, according to example embodiments.

Figure 8A:
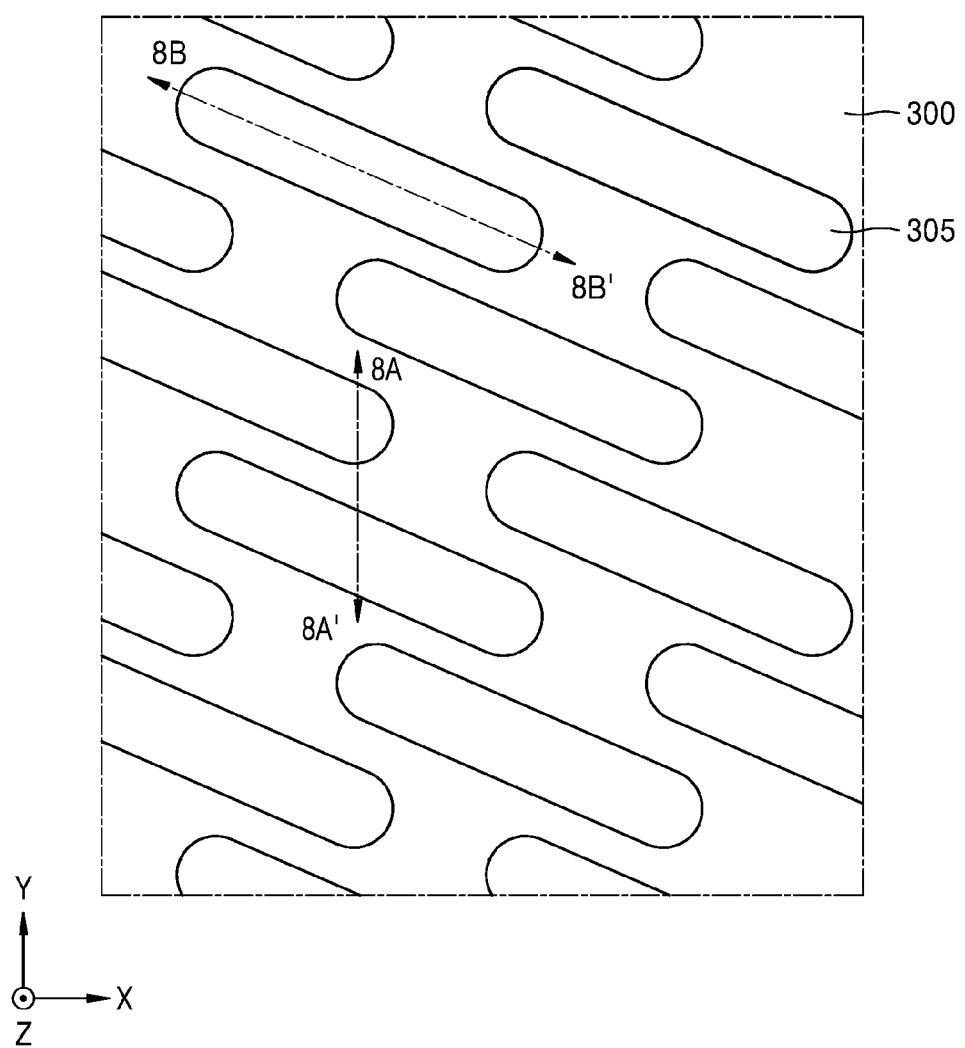
FIGS. 8A, 8B, 9A, 9B, 10A, 10B, and 11 to 20 are top views and cross-sectional views for describing the method of manufacturing a semiconductor device, according to example embodiments.
Figure 8B:
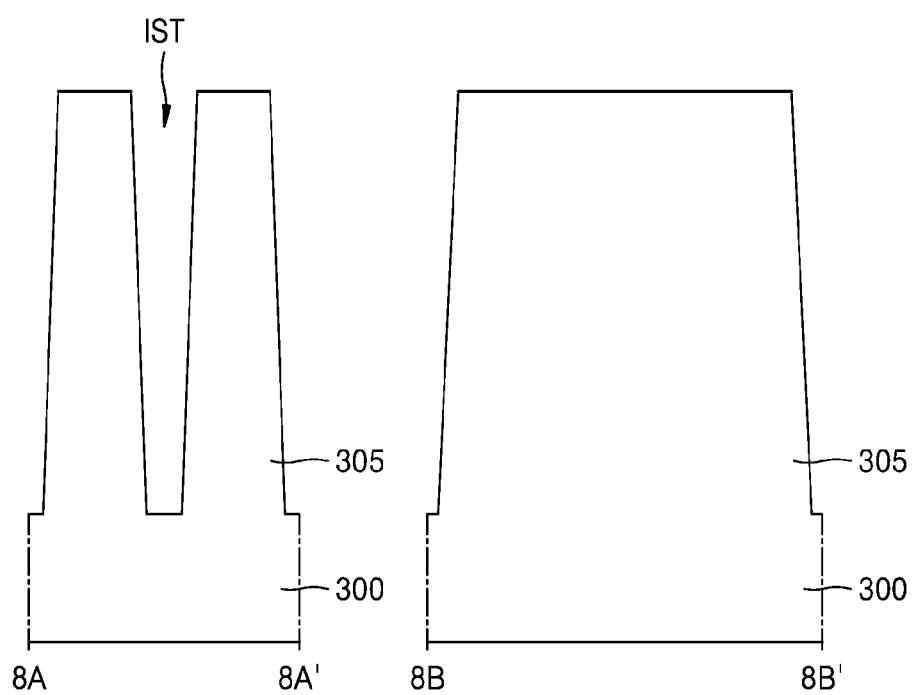
Figure 9A:
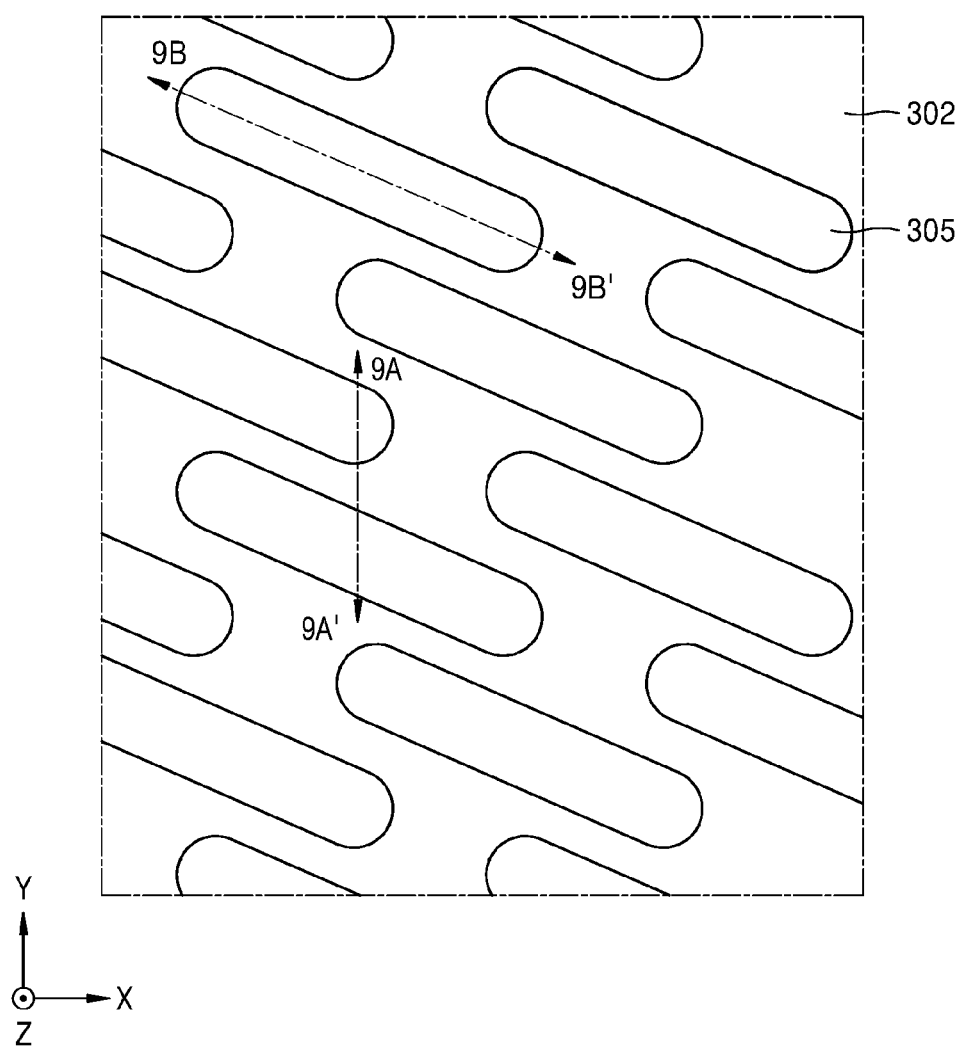
Figure 9B:
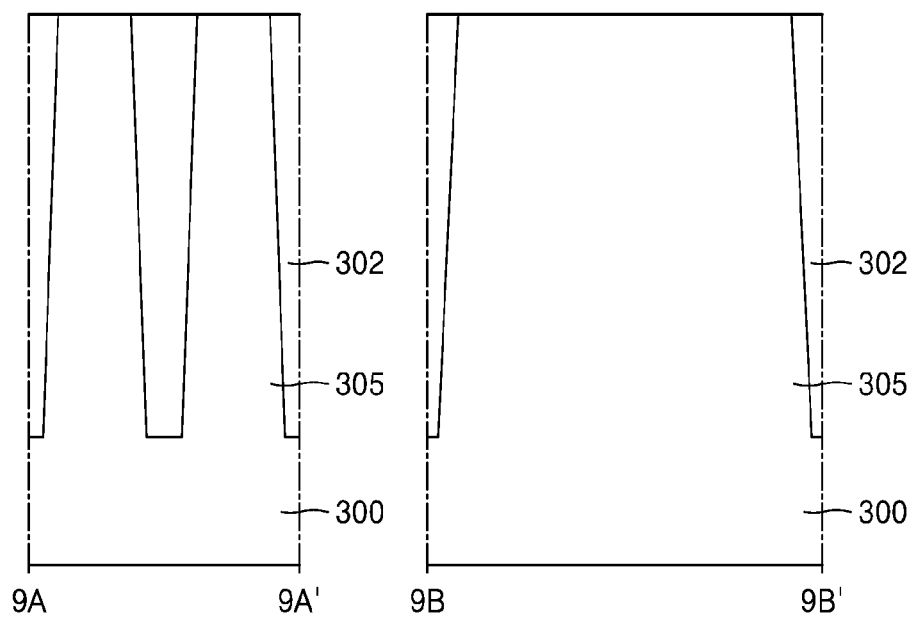
Figure 10A:
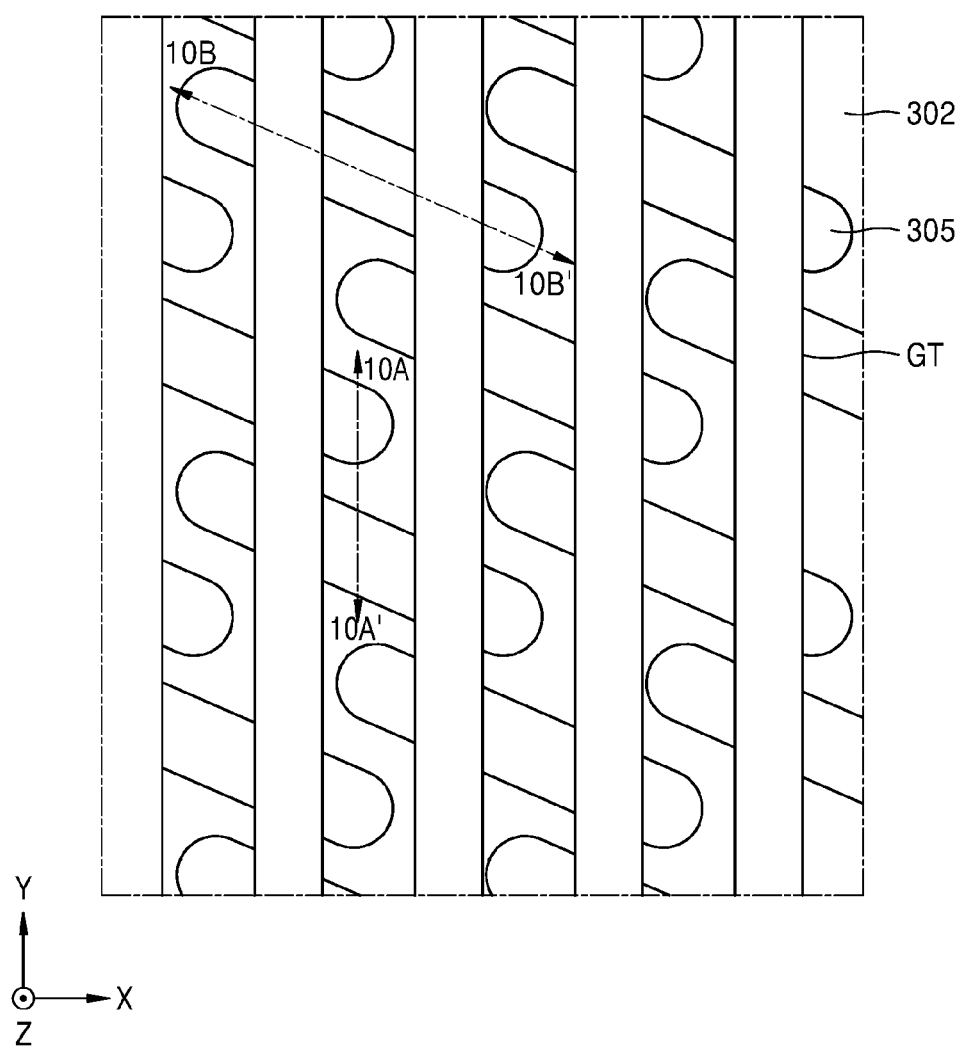
Figure 10B:
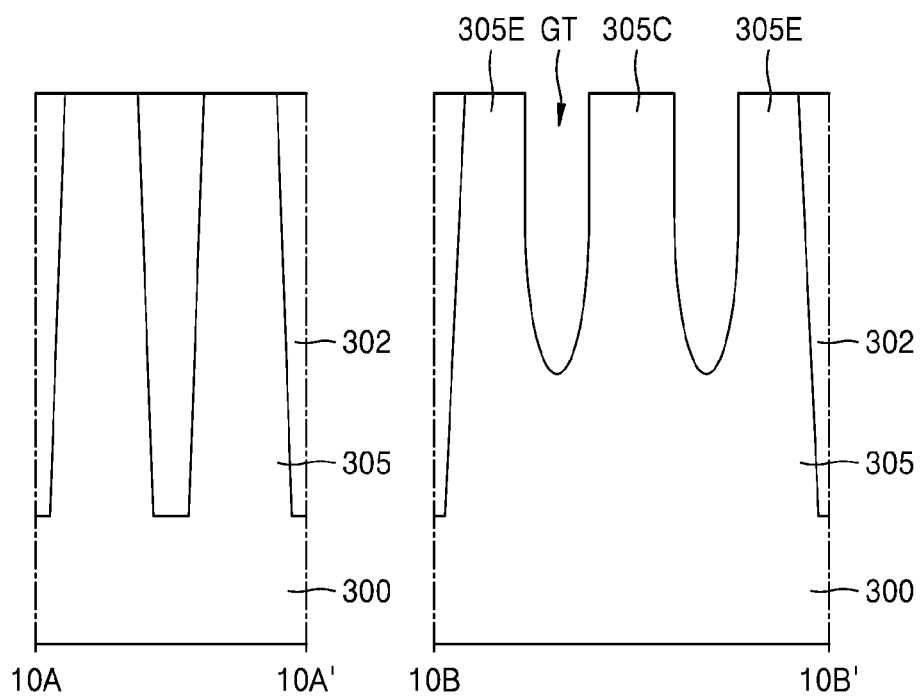

More particularly, FIGS. 8A, 9A, and 10A are layout diagrams of a structure formed on a wafer (substrate) 300 according to the progress of a process. FIG. 8B shows cross-sectional views taken along line 8A-8A' and line 8B-8B' of FIG. 8A. FIG. 9B shows cross-sectional views taken along line 9A-9A' and line 9B-9B' of FIG. 9A. FIG. 10B shows cross-sectional views taken along line 10A-10A' and line 10B-10B' of FIG. 10A.

FIGS. 11 to 20 are cross-sectional views illustrating changes of parts corresponding to FIG. 10B according to the progress of a process.

According to some embodiments, FIGS. 7 to 14 may illustrate a method of manufacturing a dynamic random access memory (DRAM) device including a buried cell array transistor (BCAT).

Referring to FIGS. 7, 8A, and 8B, a plurality of active patterns 305 and a device isolation trench IST may be formed in step P110. According to example embodiments, the plurality of active patterns 305 and the device isolation trench IST may be formed by etching an upper part of a substrate 300. The device isolation trench IST may be a space between the plurality of active patterns 305 formed by an anisotropic etching process. The plurality of active patterns 305 may extend in a direction that is oblique with respect to the X direction and the Y direction and be aligned along rows and columns.

The substrate 300 may include or may be formed of, for example, silicon, germanium, silicon-germanium, or a group III-V compound, such as gallium phosphide (GaP), gallium arsenide (GaAs), or gallium antimonide (GaSb).

According to example embodiments, a depth of the device isolation trench IST may be within a range of about 100 nm to about 250 nm. Herein, the depth of the device isolation trench IST may be a Z-direction distance between a bottom surface of the device isolation trench IST and an upper surface of each of the plurality of active patterns 305.

According to example embodiments, a width of the device isolation trench IST may be within a range of about 30 nm to about 100 nm. Herein, the width of the device isolation trench IST may be a horizontal distance (i.e., an X-direction distance and/or a Y-direction distance) between adjacent two of the plurality of active patterns 305.

Next, referring to FIGS. 1, 7, and 8B, the device isolation trench IST may be inspected in step P120. The device isolation trench IST may be inspected by using the AFM 100. Inspecting the device isolation trench IST may include inspecting the depth of the device isolation trench IST. The AFM 100 may inspect the device isolation trench IST by scanning the substrate 300, in which the device isolation trench IST is formed, in the X direction and the Y direction.

When the depth of the device isolation trench IST is excessively small, a characteristic of the BCAT may degrade, and a short-circuit may occur in that neighboring active patterns 305 are not separated from each other.

Inspecting the device isolation trench IST may be performed by the method of inspecting a sample S, which has been described with reference to FIG. 2. More particularly, the depth of the device isolation trench IST in the substrate 300 may be inspected by using the AFM 100, and if the depth of the device isolation trench IST is abnormal, the tip 121 may be inspected by using the characterization sample CS. If the tip 121 is normal, it may be determined that a process of forming the device isolation trench IST is faulty. If the tip 121 is abnormal, the probe 120 may be replaced, and then, the depth of the device isolation trench IST may be inspected again.

Inspecting the tip 121 may include measuring a width of the tip 121 at the first height H1 by using the first characterization pattern (CP1, see FIG. 3A) of the characterization sample CS. However, the inventive concept is not limited thereto, and the tip 121 may be inspected by using the second and third characterization patterns (CP2 and CP3, see FIGS. 4 and 5).

Next, referring to FIGS. 1, 9A, and 9B, a device isolation layer 302 may be formed in step P130. The device isolation layer 302 may be formed by sufficiently providing an insulating layer including silicon oxide to fill the device isolation trench IST and planarizing an upper part of the insulating layer by a chemical mechanical polishing (CMP) process or the like so that an upper surface of the active pattern 305 is exposed. The series of operations P110, P120, and P130 may be called a shallow trench isolation (STI) process.

By forming the device isolation layer 302, adjacent two of the plurality of active patterns 305 may be separated from each other with the device isolation layer 302 therebetween. An upper surface of the device isolation layer 302 may be coplanar with upper surfaces of the plurality of active patterns 305. A part where an upper surface of the substrate 300 is covered by the device isolation layer 302 may be called a field area, and a part where the upper surfaces of the plurality of active patterns 305 are exposed may be called an active area.

Next, referring to FIGS. 7, 10A, and 10B, gate trenches GT may be formed by etching an upper part of each active pattern 305 and/or an upper part of the device isolation layer 302 in step P140.

According to some embodiments, a hard mask (not shown) partially exposing therethrough an upper surface of each active pattern 305 and an upper surface of the device isolation layer 302 may be formed, and then, each active pattern 305 and the device isolation layer 302 may be partially etched by using the hard mask, thereby forming the gate trenches GT.

According to some embodiments, the gate trench GT may extend in the Y direction. The gate trench GT may penetrate into an upper part of each active pattern 305 and the device isolation layer 302 in the Z direction. According to some embodiments, the gate trenches GT may be separated from each other in a first direction (the X direction).

According to some embodiments, each active pattern 305 may horizontally intersect with two gate trenches GT. An upper part of each active pattern 305 may be divided into a center part 305C and two edge parts 305E separated from each other with the center part 305C therebetween by two gate trenches GT.

Figure 11:
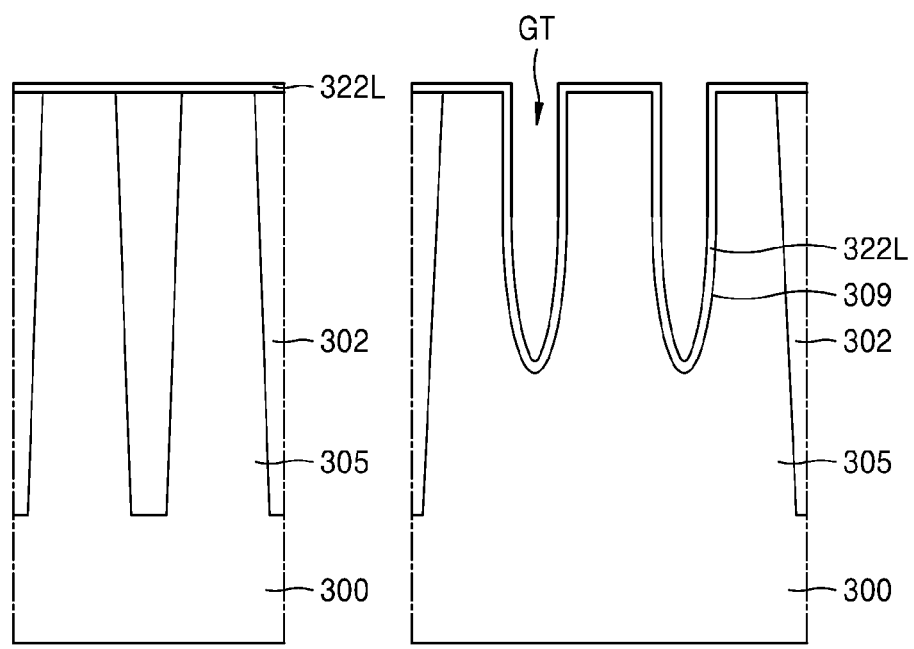

Next, referring to FIGS. 7 and 11, a dielectric material layer 322L may be formed in step P150.

For example, the dielectric material layer 322L may be formed by a thermal oxidation process on a surface of the active pattern 305 exposed by the gate trench GT. As another example, the dielectric material layer 322L may be formed by depositing silicon oxide or metal oxide on the surface of the active pattern 305 by, for example, a chemical vapor deposition (CVD) process or the like.

Next, referring to FIGS. 1, 7, and 11, the dielectric material layer 322L may be inspected in step P160. The dielectric material layer 322L may be inspected by using the AFM 100. Inspecting the dielectric material layer 322L may include measuring roughness of an upper surface of the dielectric material layer 322L. The AFM 100 may inspect the dielectric material layer 322L by scanning the substrate 300, on which the dielectric material layer 322L is formed, in the X direction and the Y direction. According to example embodiments, in step P160, a part of the dielectric material layer 322L on the active pattern 305 and the device isolation layer 302 may be inspected. According to example embodiments, in step P160, a part of the dielectric material layer 322L in the gate trench GT may not be inspected.

When the roughness of the dielectric material layer 322L is outside of a certain range, electrical characteristics of a gate electrode (320, see FIG. 14) to be subsequently formed may degrade.

Inspecting the dielectric material layer 322L may be performed by the method of inspecting a sample S, which has been described with reference to FIG. 2. More particularly, the roughness of the dielectric material layer 322L may be inspected by using the AFM 100, and if the roughness of the dielectric material layer 322L is abnormal, the tip 121 may be inspected by using the characterization sample CS. If the tip 121 is normal, it may be determined that a process of forming the dielectric material layer 322L is faulty. If the tip 121 is abnormal, the probe 120 may be replaced, and then, the roughness of the dielectric material layer 322L may be inspected again.

Inspecting the tip 121 may include measuring the sharpness of the tip 121 by using the third characterization pattern (CP3, see FIG. 5) of the characterization sample CS. However, the inventive concept is not limited thereto, and the tip 121 may be inspected by using the first and second characterization patterns (CP1 and CP2, see FIGS. 3A and 4).

Figure 12:
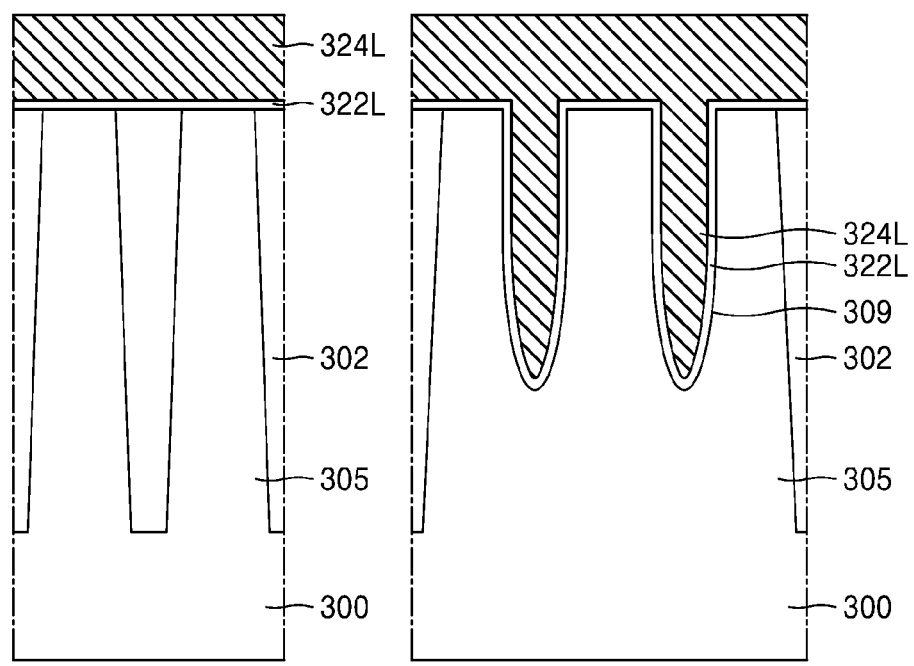

Next, referring to FIGS. 7 and 12, a gate conductive material layer 324L may be formed in step P170.

The gate conductive material layer 324L may fill a remaining portion of the gate trench GT on the dielectric material layer 322L. The gate conductive material layer 324L may be formed by, for example, an atomic layer deposition (ALD) process, a sputtering process, or the like using a metal and/or metal nitride. The gate conductive material layer 324L may include or may be formed of, for example, a material having a good step coverage, such as tungsten (W).

Figure 13:
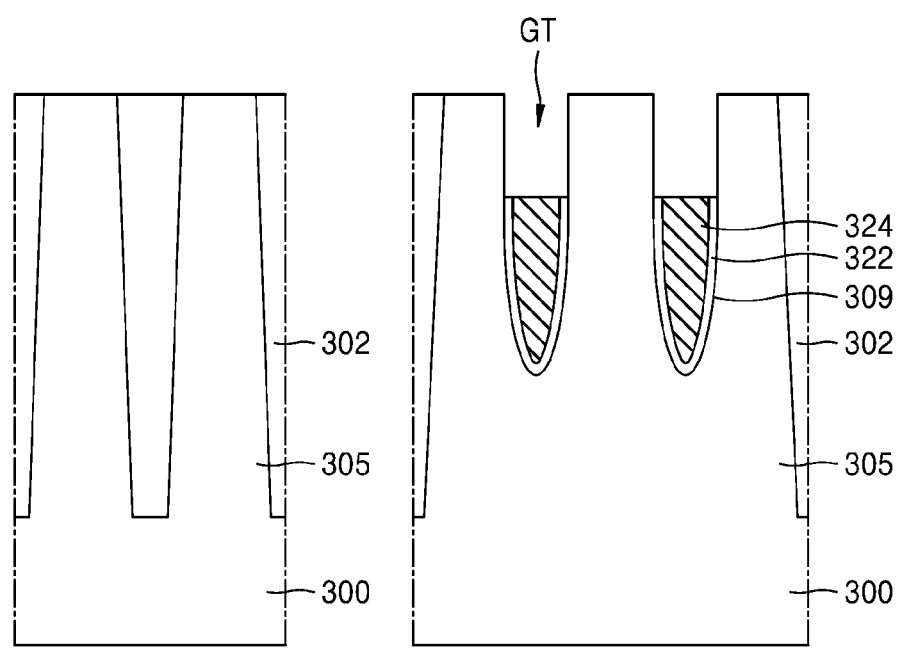

Next, referring to FIGS. 7, 12, and 13, a gate dielectric pattern 322 and a gate conductive pattern 324 may be formed in step P180.

The gate dielectric pattern 322 and the gate conductive pattern 324 may be formed by planarizing the dielectric material layer 322L and the gate conductive material layer 324L through a CMP process so that the upper surface of the active pattern 305 is exposed and removing, through an etching process, a portion of the dielectric material layer 322L and the gate conductive material layer 324L formed inside the gate trench GT. The gate dielectric pattern 322 and the gate conductive pattern 324 may fill a lower part of the gate trench GT.

Next, the gate conductive pattern 324 may be inspected in step P190.

The gate conductive pattern 324 may be inspected by using the AFM 100. Inspecting the gate conductive pattern 324 may include measuring the roughness of an upper surface of the gate conductive pattern 324. As a non-limiting example, the roughness of the upper surface of the gate conductive pattern 324 may be measured by scanning, by using the AFM 100, an inspection mark formed outside a device area shown in FIG. 13.

The inspection mark may be formed on, for example, a scribe lane that is a region for separating a plurality of chips formed on the substrate 300. The inspection mark may include the same material as the gate conductive pattern 324. The inspection mark may be formed by the same process as a process of forming the gate conductive pattern 324. The inspection mark may be formed substantially at the same time as the gate conductive pattern 324 is formed.

A grain size of a conductive material constituting the gate conductive pattern 324 may be determined from the roughness of the upper surface of the gate conductive pattern 324. That is, electrical characteristics of the gate conductive pattern 324 may be determined by inspecting the roughness of the upper surface of the gate conductive pattern 324.

Inspecting the gate conductive pattern 324 may be performed by the method of inspecting a sample S, which has been described with reference to FIG. 2. More particularly, the roughness of the inspection mark for measuring the roughness of the upper surface of the gate conductive pattern 324 above the substrate 300 may be measured by using the AFM 100, and if the roughness of the inspection mark is out of a set range, the tip 121 may be inspected by using the characterization sample CS.

If the tip 121 is normal, it may be determined that a process of forming the gate conductive pattern 324 is faulty. If the tip 121 is abnormal, the probe 120 may be replaced, and then, the roughness of the inspection mark may be measured again.

Inspecting the tip 121 may include measuring the sharpness of the tip 121 by using the third characterization pattern (CP3, see FIG. 5) of the characterization sample CS. However, the inventive concept is not limited thereto, and the tip 121 may be inspected by using the first and second characterization patterns (CP1, CP2, see FIGS. 3A and 4).

Figure 14:
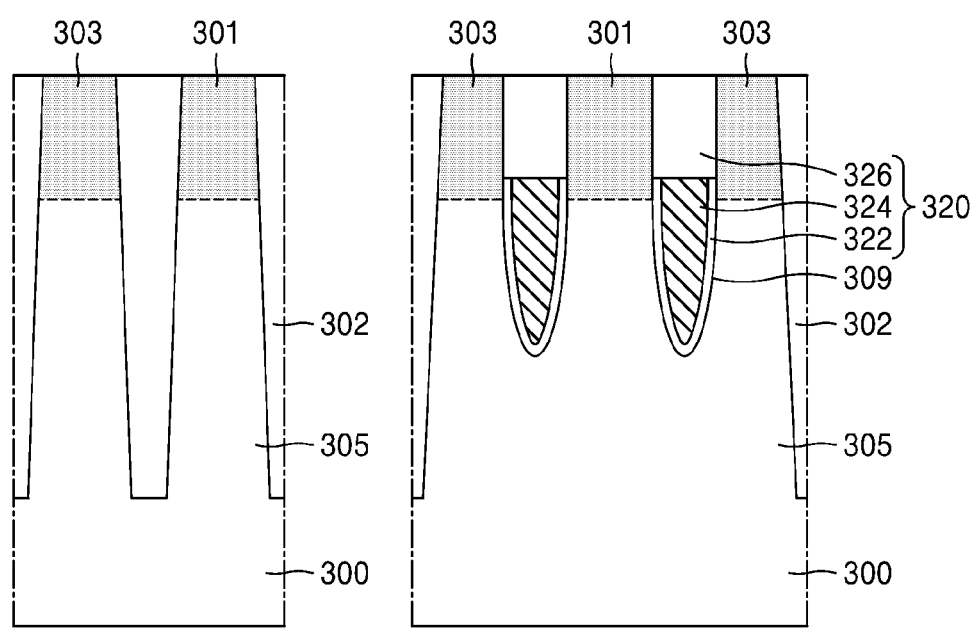

Next, referring to FIGS. 7 and 14, a gate mask 326 may be formed in step P200.

A mask layer filling a remaining portion of the gate trench GT may be formed on the gate dielectric pattern 322 and the gate conductive pattern 324, and then, the gate mask 326 may be formed by planarizing an upper part of the mask layer so that the upper surface of the active pattern 305 is exposed. According to some embodiments, the mask layer may be formed by a CVD process and include silicon nitride.

Accordingly, a word line structure 320 including a conformal gate dielectric pattern 322 covering the lower part of the gate trench GT, the gate conductive pattern 324 filling a space defined by the gate dielectric pattern 322, and the gate mask 326 covering the gate dielectric pattern 322 and the gate conductive pattern 324 and filling an upper part of the gate trench (GT, see FIG. 10A) may be formed.

According to an arrangement of the gate trenches (GT, see FIG. 10A), a plurality of word line structures 320 extending in the Y direction may be formed by being separated from each other and aligned in the first direction (the X direction). Each of the plurality of word line structures 320 may be buried in the active pattern 305. As described above, the upper part of the active pattern 305 may be divided into the center part (305C, see FIG. 10B) between two word line structures 320 and the edge parts (305E, see FIG. 10B) separated from the center part (305C, see FIG. 10B) with each of plurality of word line structures 320 therebetween.

Next, a first impurity region 301 and a second impurity region 303 may be formed by performing an ion injection process on the upper part of the active pattern 305 adjacent to the plurality of word line structures 320. According to some embodiments, the first impurity region 301 may be formed at the center part (305C, see FIG. 10B) of the active pattern 305, and the second impurity region 303 may be formed at the edge parts (305E, see FIG. 10B) of the active pattern 305.

Figure 15:
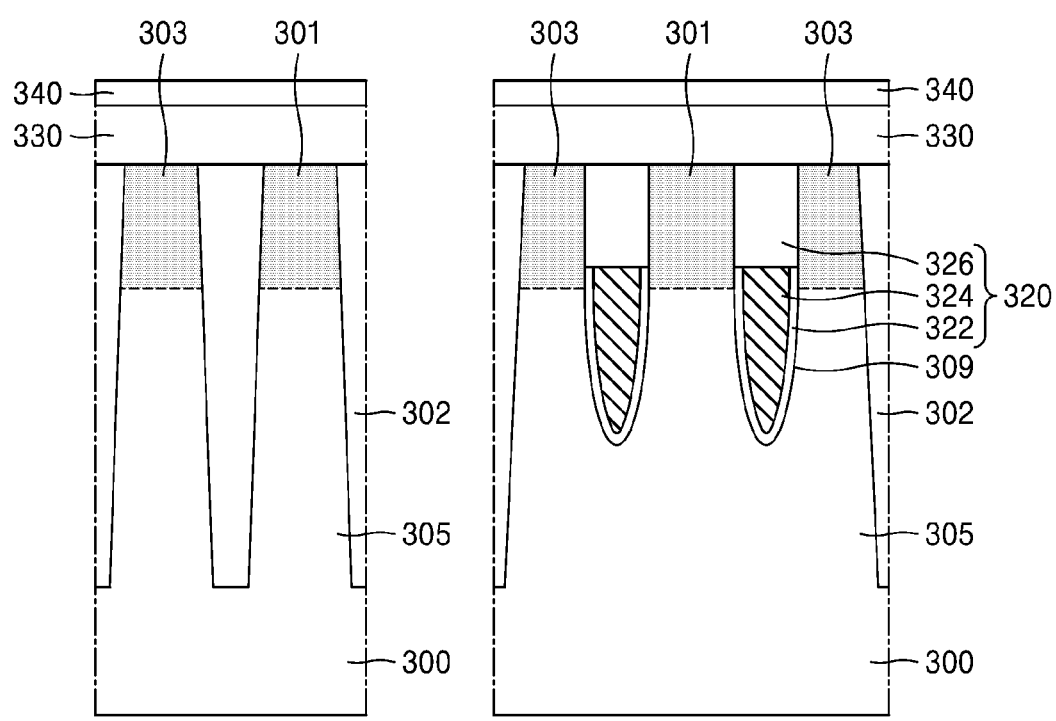

Next, referring to FIGS. 7 and 15, a capping layer 330 and a first interlayer insulating layer 340 may be formed in step P210.

The capping layer 330 covering the active pattern 305 and the device isolation layer 302 may be formed, and the first interlayer insulating layer 340 may be formed on the capping layer 330. According to some embodiments, the capping layer 330 and the first interlayer insulating layer 340 may include or may be formed of silicon nitride and silicon oxide, respectively. The capping layer 330 may function as an etching stop layer, which protects the active pattern 305 or the first and second impurity regions 301 and 303 in subsequent etching processes.

Figure 16:
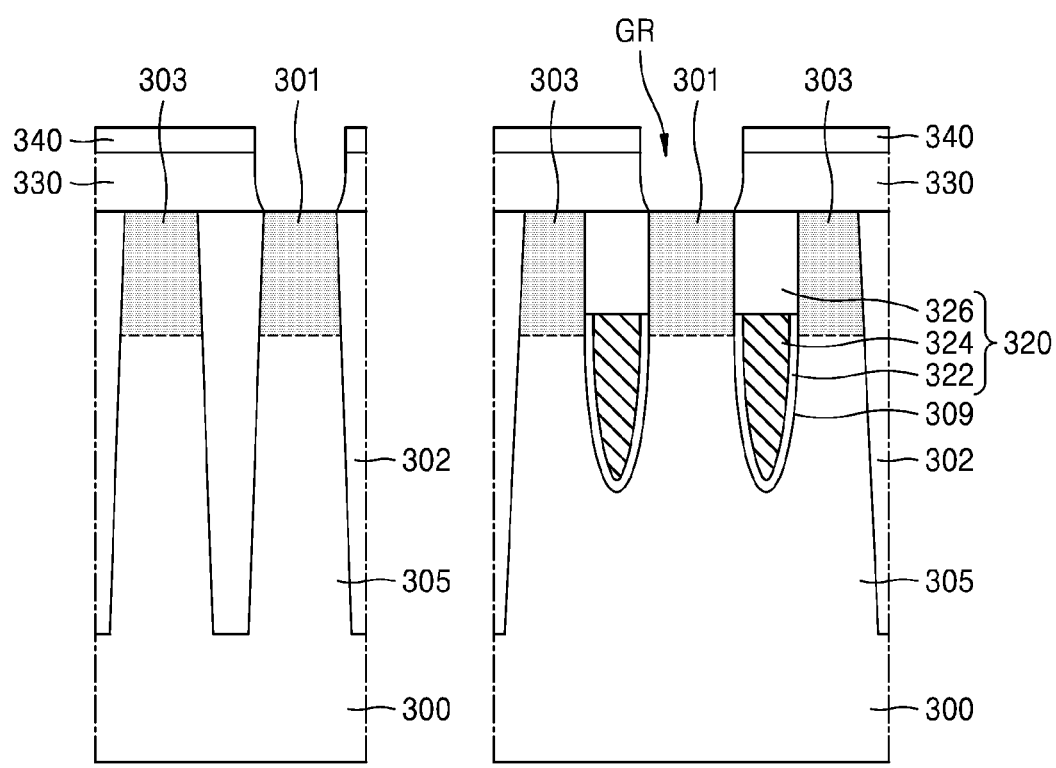

Next, referring to FIGS. 7 and 16, a groove GR may be formed in step P220.

The groove GR may penetrate through the first interlayer insulating layer 340 and the capping layer 330 in the Z direction and expose an upper surface of the first impurity region 301. The groove GR may extend in a direction (the X direction of FIG. 10A) that is perpendicular to an extension direction of the gate electrode 320. Grooves GR may be separated from each other in the Y direction (see FIG. 10A). A width of the groove GR in the Y direction (see FIG. 10A) may be within a range of about 10 nm to about 100 nm. A depth of the groove GR may be within a range of about 50 nm to about 150 nm.

According to some embodiments, a portion of the first impurity region 301 may be removed by an etching process of forming the groove GR. Accordingly, a level difference may occur between the first and second impurity regions 301 and 303, and a bridge or short circuit between a bit line structure (350, see FIG. 18) and a conductive contact (370, see FIG. 20) formed in subsequent processes may be prevented.

Next, referring to FIGS. 1, 7, and 16, the groove GR may be inspected in step P230.

The groove GR may be inspected by using the AFM 100. Inspecting the groove GR may include inspecting the depth of the groove GR. The AFM 100 may inspect the groove GR by scanning the substrate 300, above which the groove GR is formed, in the X direction and the Y direction.

When the depth of the groove GR is excessively small, there may occur an open fault that an upper surface of the first impurity region 301 is not exposed by the groove GR. When the depth of the groove GR is excessively large, an operation characteristic of the BCAT may degrade.

Inspecting the groove GR may be performed by the method of inspecting a sample S, which has been described with reference to FIG. 2. More particularly, the depth of the groove GR above the substrate 300 may be inspected by using the AFM 100, and if the depth of the groove GR is abnormal, the tip 121 may be inspected by using the characterization sample CS. If the tip 121 is normal, it may be determined that a process of forming the groove GR is faulty. If the tip 121 is abnormal, the probe 120 may be replaced, and then, the depth of the groove GR may be inspected again.

Inspecting the tip 121 may include measuring a width of the tip 121 at the second height H2 by using the second characterization pattern (CP2, see FIG. 4) of the characterization sample CS. However, the inventive concept is not limited thereto, and the tip 121 may be inspected by using the first and third characterization patterns (CP1 and CP3, see FIGS. 3A and 5).

Figure 17:
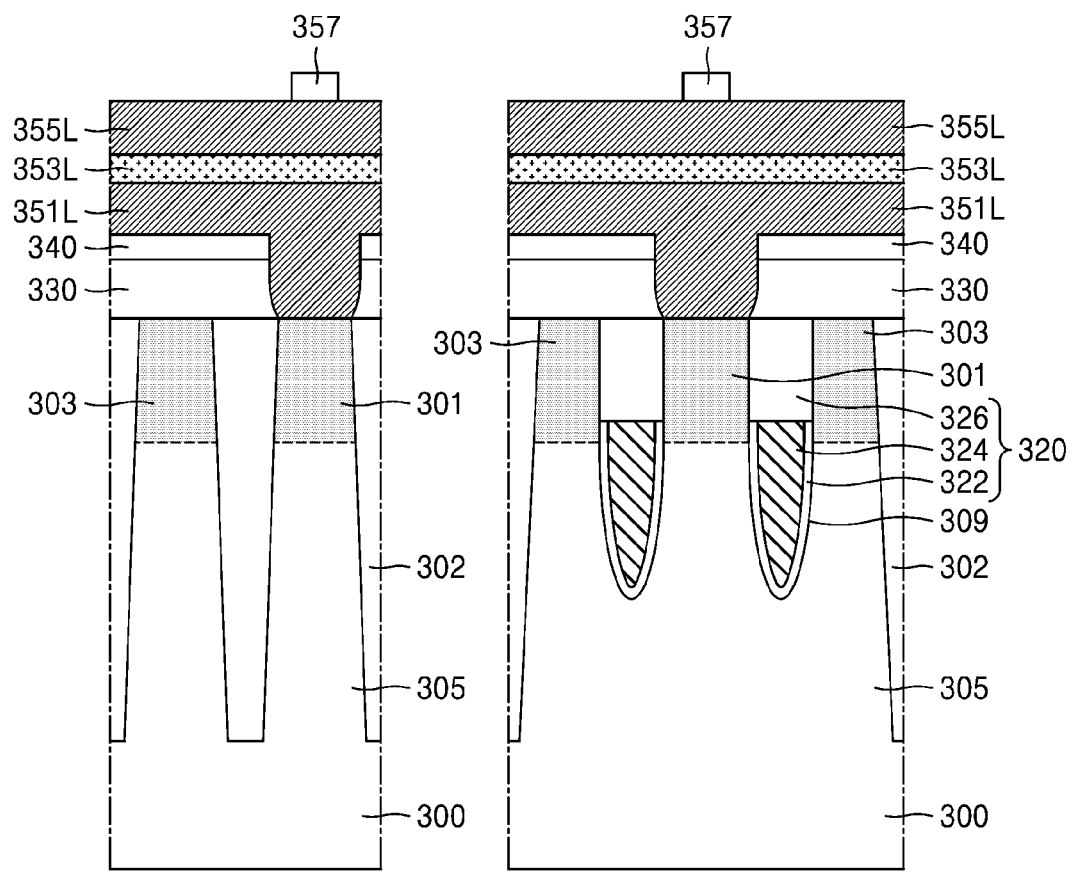
Figure 18:
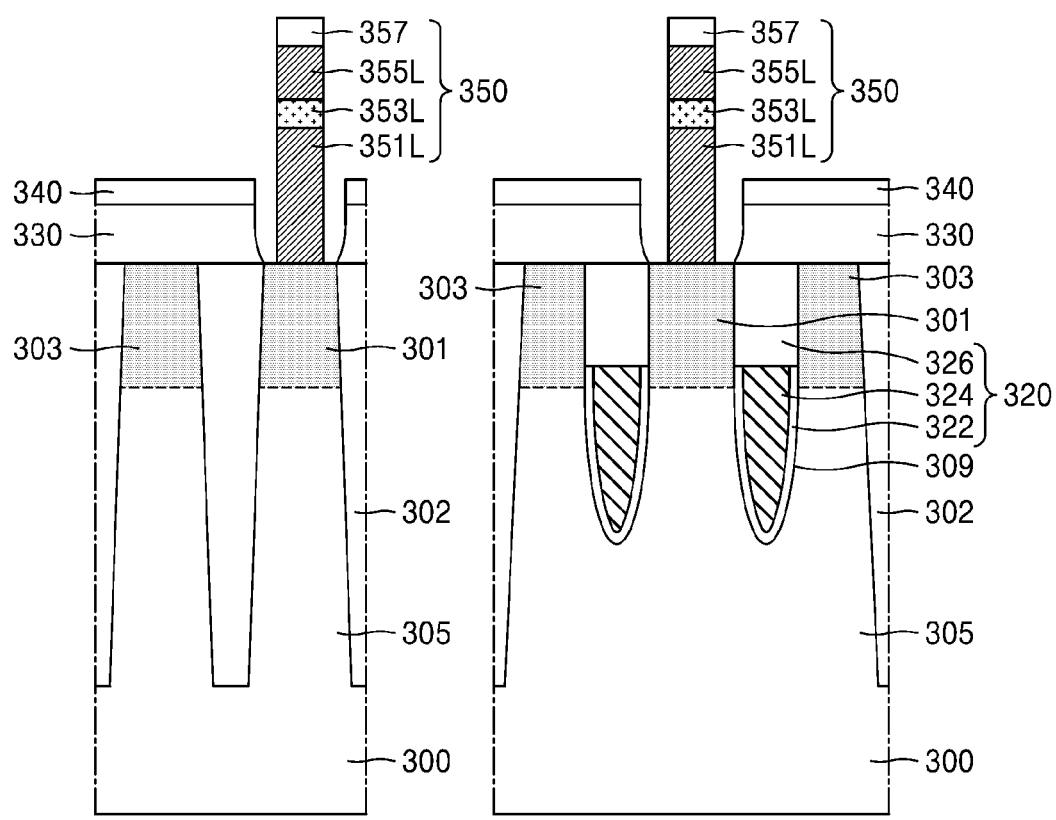

Next, referring to FIGS. 7, 17 and 18, the bit line structure 350 may be formed in step P240.

More particularly, referring to FIG. 17, a first conductive layer 351L filling the groove (GR, see FIG. 16) may be formed on the first interlayer insulating layer 340. A barrier conductive layer 353L and a second conductive layer 355L may be formed on the first conductive layer 351L. A mask pattern 357 may be formed on the second conductive layer 355L.

According to some embodiments, the first conductive layer 351L may include or may be formed of doped polysilicon. According to some embodiments, the barrier conductive layer 353L may include or may be formed of metal nitride or metal silicide nitride. According to some embodiments, the second conductive layer 355L may include or may be formed of a metal material. According to some embodiments, the first conductive layer 351L, the barrier conductive layer 353L, and the second conductive layer 355L may be formed by a sputtering process, a physical vapor deposition (PVD) process, an ALD process, or the like.

The mask pattern 357 may include silicon nitride and have a line shape extending in the X direction (see FIG. 10A). According to some embodiments, a width (e.g., a width in the first direction) of the mask pattern 357 may be less than a width of the groove GR.

Referring to FIGS. 17 and 18, the second conductive layer 355L, the barrier conductive layer 353L, and the first conductive layer 351L may be etched by using the mask pattern 357 as an etching mask. Accordingly, a first conductive pattern 351, a barrier conductive pattern 353, and a second conductive pattern 355 sequentially stacked on the first impurity region 301 may be formed.

The first conductive pattern 351, the barrier conductive pattern 353, the second conductive pattern 355, and the mask pattern 357 may constitute the bit line structure 350. The bit line structure 350 may extend in the Y direction (see FIG. 10A) on the first impurity region 301. According to some embodiments, the bit line structure 350 may have a less width than the groove (GR, see FIG. 16). Therefore, a side wall of the bit line structure 350 may be separated from a side wall of the groove (GR, see FIG. 16).

Figure 19:
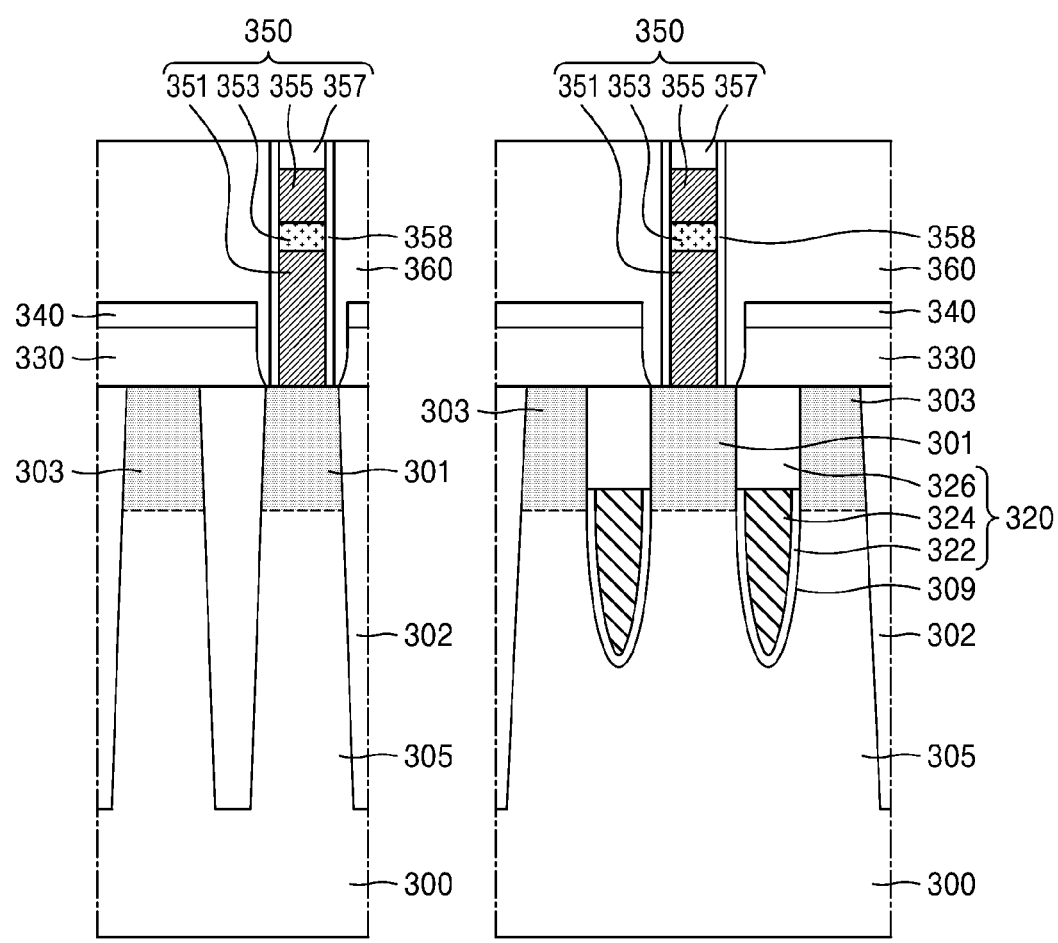

Referring to FIG. 19, a spacer 358 may be formed on the side wall of the bit line structure 350. The spacer 358 may include or may be formed of silicon nitride. According to example embodiments, a conformal material layer covering the bit line structure 350 may be formed on the first interlayer insulating layer 340, and the spacer 358 may be formed by anisotropically etching the material layer.

Next, a second interlayer insulating layer 360 covering the bit line structure 350 may be formed on the first interlayer insulating layer 340. According to some embodiments, the second interlayer insulating layer 360 may fill a remaining portion of the groove (GR, see FIG. 16), which is not filled with the bit line structure 350.

According to some embodiments, an upper part of the second interlayer insulating layer 360 may be planarized by a CMP process to expose an upper surface of the mask pattern 357. According to some embodiments, similarly to the first interlayer insulating layer 340, the second interlayer insulating layer 360 may include or may be formed of silicon oxide.

Figure 20:
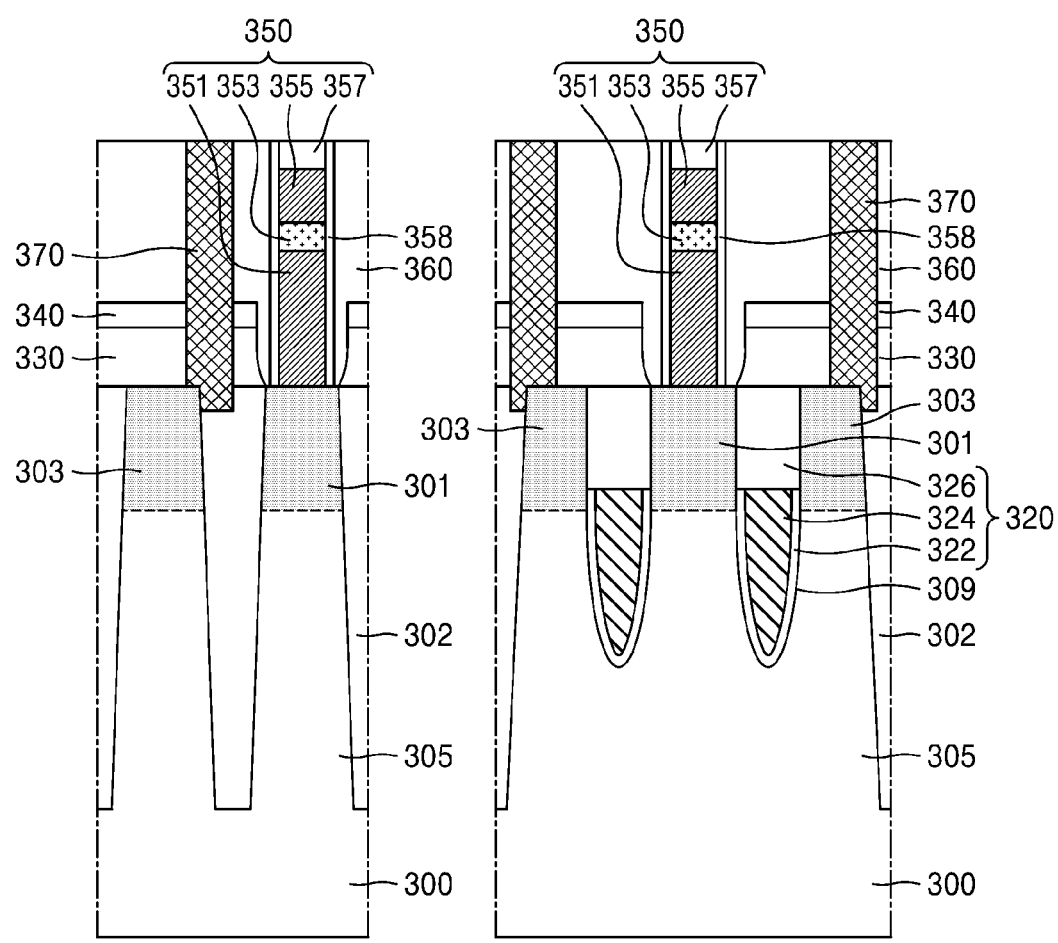

Next, referring to FIG. 20, conductive contacts 370 each connected to the second impurity region 303 by penetrating through the second interlayer insulating layer 360, the first interlayer insulating layer 340, and the capping layer 330 may be formed. The conductive contacts 370 may have a pillar shape extending in a vertical direction (i.e., the Z direction). The conductive contacts 370 may include or may be formed of, for example, a metal, such as copper, W, or aluminum, or a conductive material, such as metal nitride, doped polysilicon, or metal silicide.

According to some embodiments, the conductive contacts 370 may be formed by forming contact holes penetrating into the second impurity region 303, providing a conductive material layer to fill the contact holes through an ALD process, a CVD process, a sputtering process, or the like, and then planarizing an upper part of the conductive material layer through a CMP process so that the upper surface of the mask pattern 357 is exposed. According to some embodiments, a barrier conductive layer including titanium, titanium nitride, or the like may be further provided between the conductive contacts 370 and the second interlayer insulating layer 360.

Next, a DRAM including the BCAT may be provided by sequentially performing a storage node forming process and a plate electrode forming process.

While the inventive concept has been particularly shown and described with reference to embodiments thereof, it will be understood that various changes in form and details may be made therein without departing from the spirit and scope of the following claims.

What is claimed is:

1. A method of operating an atomic force microscope (AFM), the method comprising:
   inspecting a sample by using the AFM; and
   inspecting a tip of a probe of the AFM by using a characterization sample,
   wherein the characterization sample comprises:
   a first characterization pattern that includes a line and space pattern of a first height;
   a second characterization pattern that includes a line and space pattern of a second height that is lower than the first height; and
   a third characterization pattern that includes a line and space pattern of a third height that is lower than the second height, and includes a rough surface.

2. The method of claim 1, wherein the first height is within a range of 100 nm to 250 nm.

3. The method of claim 1, wherein the second height is within a range of 50 nm to 150 nm.

4. The method of claim 1, wherein a root mean square surface roughness of the rough surface of the third characterization pattern is within a range of 0.5 nm to 1.5 nm.

5. The method of claim 1, wherein the first characterization pattern is used to measure a width of the tip at the first height, and the second characterization pattern is used to measure a width of the tip at the second height.

6. The method of claim 1, wherein the third characterization pattern is used to measure a sharpness of the tip.

7. The method of claim 1, wherein inspecting the tip comprises scanning only some selected from among the first to third characterization patterns, based on an inspection result of the sample.

8. The method of claim 1, wherein inspecting the tip comprises sequentially scanning the first to third characterization patterns.

* * * * *